(12) United States Patent
Gasse et al.

(10) Patent No.: US 7,825,385 B2
(45) Date of Patent: Nov. 2, 2010

(54) DEVICE FOR DETECTING ELECTROMAGNETIC RADIATION AND IONIZING RADIATION HAVING AN ISOTROPIC TRANSFER LAYER

(75) Inventors: Adrien Gasse, Grenoble (FR); Marc Arques, Grenoble (FR); Lydie Mathieu, Pommiers la Placette (FR); Andrea Brambilla, Veurey-Voroize (FR)

(73) Assignee: Commissariat à l'Energie Atomique, Paris (FR)

( * ) Notice: Subject to any disclaimer, the term of this patent is extended or adjusted under 35 U.S.C. 154(b) by 162 days.

(21) Appl. No.: 12/337,104

(22) Filed: Dec. 17, 2008

(65) Prior Publication Data

US 2009/0166544 A1 Jul. 2, 2009

(30) Foreign Application Priority Data

Dec. 31, 2007 (FR) .................................. 07 60454

(51) Int. Cl.
*H01L 25/00* (2006.01)
(52) U.S. Cl. ................................ 250/370.09
(58) Field of Classification Search ........................ 250/370.01–370.15; 378/98.8
See application file for complete search history.

(56) References Cited

U.S. PATENT DOCUMENTS

| 4,783,594 A | 11/1988 | Schulte et al. | |
| 5,168,338 A | 12/1992 | Kumada et al. | |
| 5,693,947 A * | 12/1997 | Morton | 250/370.09 |
| 6,396,712 B1 | 5/2002 | Kuijk et al. | |
| 6,512,233 B1 | 1/2003 | Sato et al. | |
| 2002/0168198 A1 | 11/2002 | Imai | |
| 2003/0025106 A1* | 2/2003 | Schwark et al. | 252/500 |
| 2003/0215056 A1 | 11/2003 | Vuorela | |
| 2005/0133744 A1 | 6/2005 | Imai | |

FOREIGN PATENT DOCUMENTS

| EP | 1041400 | 10/2000 |
| JP | 05167057 | 7/1993 |
| JP | 2002334983 | 11/2002 |

OTHER PUBLICATIONS

Republic of France International Search Report dated Aug. 27, 2008 (3 pgs.).

* cited by examiner

*Primary Examiner*—David P Porta
*Assistant Examiner*—Kiho Kim
(74) *Attorney, Agent, or Firm*—TD Evans, P.C.

(57) ABSTRACT

This device for detecting electromagnetic radiation, in particular X-ray or γ-rays, includes: a sensing layer consisting of at least one material capable of interacting with said electromagnetic radiation to be detected, in order to liberate mobile charge carriers, whereof the movement generates an electric current; a substrate provided with a plurality of elementary collectors of the charge carriers thus liberated, said elementary collectors being distributed discretely; a transfer layer suitable for transferring the charge carriers liberated by the sensing layer at the elementary collectors, said layer being connected to the sensing layer; and an insulating adhesive mating layer, suitable for mating the plurality of elementary collectors and the transfer layer.

12 Claims, 2 Drawing Sheets

DEVICE FOR DETECTING ELECTROMAGNETIC RADIATION AND IONIZING RADIATION HAVING AN ISOTROPIC TRANSFER LAYER

CROSS REFERENCE TO RELATED APPLICATIONS

This application claims priority under 35 U.S.C. §119 from French Patent Application No. 0760454 filed on Dec. 31, 2007 in the French Patent Office, the entire disclosure of which is incorporated herein by reference.

FIELD OF THE INVENTION

The present invention relates to a device for detecting electromagnetic radiation, and ionizing radiation, in particular X-rays and/or γ rays. The present invention therefore relates to the field of sensors, whether they are matrix sensors having one or two dimensions or other forms of sensors.

The present invention relates more specifically to the structure for electric interconnection and mating between the components of such a sensor.

BACKGROUND OF THE INVENTION

In the field of sensors designed to produce digital images, the prior art contains two different principles for converting the electromagnetic rays to electrons and, hence, to digital signals. The first of these two principles, called "indirect conversion", consists in converting the X-rays to visible light photons in a scintillator material, and then in converting the visible light photons to electrons by means of photodiodes prepared on boards of half-conductive material, such as amorphous silicon.

However, in a manner known per se, the sensors operating according to this first principle have limited performance in terms of resolution and sensibility to low exposure dose. In a manner known per se, the resolution is defined as the capacity of a sensor to distinguish two points—objects in the digital image produced. The sensitivity is defined in a manner known per se as the capacity of the sensor to detect a certain quantity of incident photons.

The second conversion principle, developed and implemented more recently, is called "direct conversion". The sensors operating according to this second principle are required to have superior performance to the previous sensors, in particular a finer resolution and a higher sensitivity to a low dose.

Since this is the fundamental performance of a sensor, any improvement to this performance is likely to concern all fields in which sensors are used to produce digital images, in particular in the fields of medical imaging, scientific and space instruments or nondestructive testing.

This direct conversion principle is described here in relation to FIG. 1, which is a schematic representation of a cross section of a prior art sensor. Direct conversion is achieved regardless of the frequency range of the incident electromagnetic radiation, of the X or γ type.

The direct conversion sensor shown in FIG. 1 is prepared and operates by the technique called "flip chip". The incident electromagnetic rays are converted directly to electrons in the sensing layer 11, which is generally prepared from materials having a high atomic density, such as CdTe, or lead or mercury halides, such as $PbI_2$ and $HgI_2$, etc. The electrons thus generated by the interactions of the incident photons with the sensing layer 11 form electric currents, whereof the strength is proportional to the energy and to the number of incident photons. These electric currents are collected and flow in conductive pads 15 to travel up to the read circuit in order to be quantified and hence "digitized" therein.

In a manner known per se, each of the conductive pads 15 corresponds to a pixel of the matrix forming the digital image. The conductive pads 15 are consequently distributed discretely and uniformly in the two planar dimensions of the sensor.

Between each of the pads 15 and the sensing layer 11, an electrode 16 is generally placed, made from a conductive material such as gold, suitable for effectively collecting the charge carriers, electrons or holes, issuing from the interactions between photons and matter.

The conductive pads 15 are each mounted on a conductive pad 13, for example aluminum, whose role is to transmit the collected currents to the read substrate 12. The read substrate 12 may comprise a board made from amorphous or polycrystalline silicon, or even an "Application Specific Integrated Circuit" (ASIC), or of the CMOS semiconductor type. The electric currents may then be read and used in a manner known per se by the read circuit to produce a digital image representative of the scene observed.

Furthermore, the conductive pads 15 are made from an adhesive material having an isotropic conductivity. Such an adhesive generally consists of a polymer matrix including uniformly distributed metallic charges, whose role is to provide the electric conduction.

The adhesive that forms the pad 15 also has the function of providing the mechanical cohesion between the pads 13 of the read circuit and the sensing layer 11, generally provided with electrodes 16. Thus, the sensor shown in FIG. 1 is prepared by the mutual mating and bonding of two planar components by means of a multitude of adhesive points distributed in a regular grid corresponding to the arrangement of the pixels of the matrix of the sensor.

During the fabrication of the sensor, the conductive pads 15 are disposed at each of the pads 13 of the read circuit, and the sensing layer 11 is then added on to the conductive pads, the overall assembly then undergoing a treatment for curing of the adhesive pads 15.

The structure of the sensor shown in FIG. 1 therefore serves, in addition to the mechanical mating discussed above, for the integral transmission of the signals or electric currents from the sensing layer 11 to the read circuit 12-13. In the context of the present invention, "integral" means a transmission that takes place without inter-pixel leakage current, that is, without leakage current between neighboring conductive pads 15.

In fact, in a continuous planar structure like the one of the sensing layer 11, charge carriers exist, directed toward the neighboring pixels of the interaction site instead of traveling toward the nearest pixel or conductive pad 15. In a manner known per se, these inter-pixel leakage currents or leakage currents within the sensing layer 11 cause a degradation of the image quality, that is, a lowering of the ratio of the coherent signal to the undesirable noise. This degradation must, whenever possible, be offset by a complex and therefore costly image processing.

The structure described with regard to FIG. 1 therefore has the advantage of isolating the conductive pads 15 from one another, hence of preventing the leakage currents at their level. Thus, the electrons which reach the electrode 16 are "captured" by the adjacent conductive pad 15 thereby tending to maximize the signal-to-noise ratio of the digital image.

However, the step of fabrication of the sensor consisting in discretely positioning each of the pads of conductive adhesive 15 requires especially high accuracy as the desired resolution is finer.

Moreover, it is important to deposit an identical quantity of adhesive material for each of the pads 15 in order to guarantee an effective electrical connection between the parts to be mated. The batching of this quantity of material must therefore be very precise.

In fact, the precision required for the batching and positioning of the pads 15 often proves to be difficult to obtain and always sharply increases the production cost of the sensor, regardless of the technique employed (screen-printing, dispense, etc.).

Furthermore, depending on the adhesive material selected to prepare the pads 15, the speed of deposition of all the pads 15 may exert some influence on the quality of the bonding, and hence on the electrical conduction. This speed represents an even more critical parameter as the dimensions of the sensor are larger.

Moreover, this type of connection does not allow for sufficient overall mechanical strength.

In the context of the electrical interconnection of two components, document U.S. Pat. No. 6,396,712 describes the use of a conductive layer having isotropic resistivity simultaneously performing the functions of interconnection and mating of said components. The possibility of repair is mentioned, using as an electrically conducting layer, a thermoplastic material having a well known low adhesive capacity.

The application of the teachings of this document is therefore confronted with major difficulty for the full control of the uniformity of the conduction and mating properties.

Document JP5-167057 describes an electromagnetic wave detection device comprising a sensor made from CdTe prepared on a substrate transparent to the radiation to be detected, and provided with continuous electrodes on each of its faces, respectively made from CdS and from a-Si:H, that is, of amorphous silicon, and respectively playing the role of an electron stopping layer and a charge accumulation layer. The latter is electrically conductive in order to permit the transfer of the charges to the read circuit via the electrodes and the discretely distributed connection pads.

This type of device has certain limits insofar as a pixelization of the sensors is necessary to produce contacts on amorphous silicon. In fact, this pixelization constitutes a meticulous and costly step, making use of the photolithography technology, in addition to complex mating alignment equipment. Moreover, this mating is only effective via the connection pads, and this significantly affects the mechanical strength and reliability of the overall sensor. Besides, the preparation of electrodes in contact with the sensor material incurs a risk of local damage to this material.

Finally, document JP2002-334983 describes an imager comprising a transparent substrate associated with a transparent conductor and a photoconductor, provided at its terminals with an electron hole blocking layer, that is, a layer for blocking electrical carriers, and an electronic blocking layer. Also mentioned is a resistive protection layer prepared from an amorphous half-conductive material such as for example a-Se or a-Si. Conductive hybridization beads made from indium, provide the mating function, and connect the assembly thus formed to electrodes arranged on a read circuit. The overall assembly is laminated.

It appears from this structure that it is necessary to hybridize the read circuit with a soft material, in this case indium, in order to carry out the lamination.

In the absence of bonding layers on the resistive protection layer of amorphous half-conductor, it turns out that the overall mechanical strength is very low.

In short, we do not have today a technology for electrical interconnection between a sensing layer and a read circuit overcoming the problems of accuracy and performance, and serving to produce an assembly having reliable mechanical strength, long service life, and also simple to use, and easily reparable according to certain embodiments.

The present invention therefore relates to a device for detecting electromagnetic radiation and not having the drawbacks of the prior art sensors.

SUMMARY OF THE INVENTION

The present invention serves, in particular, to solve the technical problems discussed above by proposing a configuration of a sensor of radiation, particularly X-rays or γ rays, with direct conversion, offering a simple, robust and efficient method for fabricating large imagers, typically larger than 10×10 cm, and furthermore, not using the costly techniques of methods such as photolithography. More specifically, the invention proposes to disconnect the functions of interconnection, that is, the connection of charges generated under the action of the radiation within the photosensing layer toward the read circuit, and the mating of said photosensing layer to the read circuit, making it possible, in doing so, to optimize the performance of each of the functions, collection and mating respectively.

For this purpose, the invention proposes a device for detecting electromagnetic radiation and ionizing radiation, in particular X-ray or γ rays, comprising: a sensing layer consisting of at least one material capable of interacting with said electromagnetic radiation to be detected, in order to liberate mobile charge carriers, whereof the movement generates an electric current; a substrate provided with a plurality of elementary collectors of the charge carriers thus liberated, said elementary collectors being distributed discretely; an electrically conductive isotropic adhesive transfer layer, connected to the sensing layer and suitable for transferring the charge carriers liberated by the sensing layer at the elementary collectors; an electrically insulating adhesive mating layer, for mating the plurality of elementary collectors and the transfer layer.

According to the invention, the transfer layer consists of an electrically conducting adhesive polymer layer in contact with the sensing layer, and the mating layer consists of an insulating adhesive polymer layer, in contact with said first layer and the substrate provided with its elementary collectors.

In other words, the invention consists in dissociating the interconnection and adhesive functions by means of two adhesive polymers, one resistive and the other insulating.

In doing so, it becomes possible to optimize the uniformity of resistive behavior of the interconnection layer (resistive layer) independently of the mating function.

According to the invention, the conductive, or resistive adhesive polymer layer is continuous and has an isotropic resistivity.

In other words, the sensor of the invention has a transfer or interconnection layer that is common to all the elementary collectors, and in which the charge carriers can move without any preferential direction.

According to the invention, the transfer yield of the resistive adhesive polymer layer is higher than 50%, and in particular higher than 75%, said yield being defined by the expression:

$$(R_H+R_V+R_{in})/[R_H+(R_V+R_{in})*(1+K)]$$

where:

$R_V$ is the resistance of the transfer layer (25) measured substantially perpendicular to an elementary collector; $R_H$ is the resistance of the transfer layer (25) measured in a direction contained in a plane substantially parallel to the sensing layer; this resistance may be qualified as "horizontal", although the leakage currents may travel in oblique paths; $R_{in}$ is the input resistance, also called "input impedance" of any one of the elementary collectors; it is the resistance viewed by the device that is connected; K is a number and a multiple of 4, representing the number of elementary collectors next to the elementary collector considered.

In other words, the resistances traversed by the electric currents have resistivities and dimensions limiting the "planar" leakage currents to maximize the "useful" or "transverse" currents.

In practice, the resistance of the transfer layer is measured substantially perpendicular to an elementary collector of the transfer layer, and this is negligible compared to the resistance of the sensing layer measured substantially perpendicular to the same elementary collector. Moreover, the intrinsic resistance of each elementary collector is negligible compared to the sum of the above two resistances. Furthermore, the quotient defined in the numerator by the resistance of the transfer layer, measured in a direction contained in a plane substantially parallel to the sensing layer, and in the denominator by the sum of the input resistance of any one of the elementary collectors and the resistance of the transfer layer measured substantially perpendicular to an elementary collector, is higher than 3 and in particular higher than 11 in the case in which only the four nearest neighbors are considered (that is, for K=4).

According to the invention, the resistive adhesive polymer layer is an organic, thermoplastic or thermoset material, composed for example of polymers selected from the group comprising epoxies, acrylates, polyurethanes and silicones. This material comprises conductive particles consisting of an element selected from the group comprising for example carbon, gold, platinum, silver, nickel, aluminum and copper.

Advantageously, these conductive particles have a submicron size.

Advantageously, the resulting adhesive has a Shore D hardness lower than 100 when it is polymerized.

Alternatively, the material constituting the resistive adhesive polymer layer may thus consist of an intrinsically conductive polymer, selected from the group comprising polyaniline, polypyrole and polythiophene, such a polymer being integrated in a polymer adhesive of the epoxy or acrylate type.

According to another feature of the invention, the electrically insulating adhesive polymer layer consists of an organic, thermoplastic or thermoset material, selected from the group comprising epoxies, acrylates and silicones.

Advantageously, it has a viscosity lower than 100 Pa·s, or even lower than 10 Pa·s.

BRIEF DESCRIPTION OF THE DRAWINGS

The manner in which the invention can be implemented and the advantages thereof will appear more clearly from the exemplary embodiment that follows, provided for information and nonlimiting, in conjunction with the appended figures.

DETAILED DESCRIPTION OF THE INVENTION

Figure 3:
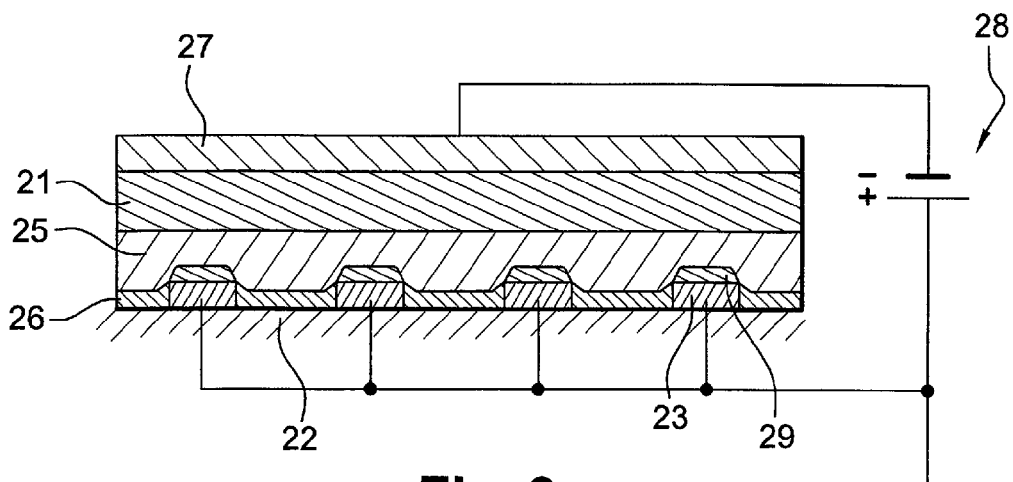
FIG. 3 is a schematic representation of a simplified cross section of a sensor according to the invention.

FIG. 3 shows a device for detecting electromagnetic radiation and ionizing radiation according to the invention. In the present case, this device is more particularly intended for detecting X-rays or γ rays, but the present invention may also apply to the detection of electromagnetic radiation having different energy spectra or charged particles.

According to the invention, the sensor comprises a sensing layer 21 also called photodetector, consisting of one or more materials capable of interacting with the incident rays, in order to liberate mobile charge carriers. These mobile charge carriers may be electrons or holes, and therefore carry negative or positive charges.

In a manner known per se, the travel of these mobile charge carriers, under the action of a bias voltage 28, generates electric currents, of which the strength is representative of the energy deposited by the incident rays and, hence, of the scene observed.

After this direct conversion step in the sensing layer 21, the charge carriers or currents must be collected locally at the zone of impact of the incident ray, in order to reconstruct a two-dimensional image. For this purpose, the detection of the invention comprises a substrate 22 having a plurality of elementary collectors 23 distributed discretely, in order to form a grid or a matrix. The elementary collectors 23 serve to collect or to drain the charge carriers liberated by the interactions between photons and matter.

In the example described, the elementary collectors 23 consist of protuberant pads. These pads or elementary collectors 23 are mutually independent, that is, they are electrically insulated from one another, so that each only collects the charge carriers produced at their pixel. By definition, a pixel represents an elementary area of the image and, by extension, of the sensor. This elementary area usually consists of a square. Each of the elementary collectors 23 is therefore surrounded by electric insulation on its sides, and its base constitutes the read substrate 22.

Between the sensing layer 21 and the elementary collectors 23, the sensor according to the invention has: an interconnection layer 25, thus called due to the function it performs, which consists in enabling the transfer of the charge carriers liberated by the interactions between photons and matter, from the sensing layer 21 toward the various elementary collectors 23; and a mating layer 26, for mating the collectors 23 with the transfer layer 25.

According to the invention, the interconnection layer 25 extends continuously between the sensing layer 21 and the elementary collectors 23. Accordingly, it ensures an electrical contact between the sensing layer 21 and the elementary collectors 23 of the read substrate.

This structural feature of the interconnection layer 25 automatically serves to eliminate the drawbacks of the sensors of the prior art. In fact, it is no longer necessary to operate with a high positioning accuracy or batching, because said layer is henceforth applied continuously to the entire surface of the sensor, and in the present case, on the overall surface of the sensing layer 21. This layer may, for example, have the form of an adhesive polymer film with a controlled and isotropic resistivity.

In other words, the resistivity of the interconnection layer 25 is identical regardless of the direction of the current flowing through it. This feature serves to guarantee a proper circulation of the currents from the sensing layer 21 toward the elementary collectors 23, and thereby ensure correct general operation of the sensor.

This isotropic conductivity therefore guarantees path length times of the charge carriers in said interconnection layer 25 substantially similar from one pixel to another, thereby guaranteeing the quality of the final digital image.

The resistivity of this continuous interconnection layer 25 must also be sufficiently low to allow the transfer of the charges vertically toward the interconnection pads, and yet sufficiently high to ensure the insulation between adjacent pixels.

In other words, the electrode (and for example the anode in the case of negative charge carriers) constituted by this continuous interconnection layer is made from a material having a highly resistive conductive behavior so that it can simultaneously allow vertical charge transfer, in the example described, from the sensing layer 21 to the elementary collectors 23 of the signal processing substrate, and at the same time provide some electrical insulation between each fictive pixel of the sensing layer 21 to allow the fabrication of a functionally pixelized image sensor from a non-physically pixelized photodetector.

Furthermore, and according to another feature of the invention, the transfer yield of the interconnection layer 25 is higher than 50% and even higher than 75%. The transfer yield correspond to the ratio of the quantity of charged carriers effectively transferred from the sensing layer 21 to an elementary collector 23 to the quantity of charged carriers that are dispersed in the form of leakage currents toward the neighboring elementary collectors. This transfer yield can be defined by the equation: $(R_H+R_V+R_{in})/[R_H+(R_V+R_{in})*(1+K)]$, where: $R_V$ is the resistance of the interconnection layer 25 measured substantially perpendicular to an elementary collector 23; $R_H$ is the "horizontal" resistance of the interconnection layer 25 measured in a direction contained in a plane substantially parallel to the sensing layer 21; $R_{in}$ is the intrinsic resistance of any one of the elementary collectors 23; K is a number and a multiple of 4, representing the number of elementary collectors 23 next to the elementary collector considered.

Thus, the interconnection layer 25 according to the invention has a transfer yield higher than 50% and even higher than 75%, the sensor has a satisfactory signal-to-noise ratio to produce digital images. Obviously, depending on the application and hence on the desired image quality, it is possible to select a transfer layer having a higher or lower transfer yield.

Figure 1:
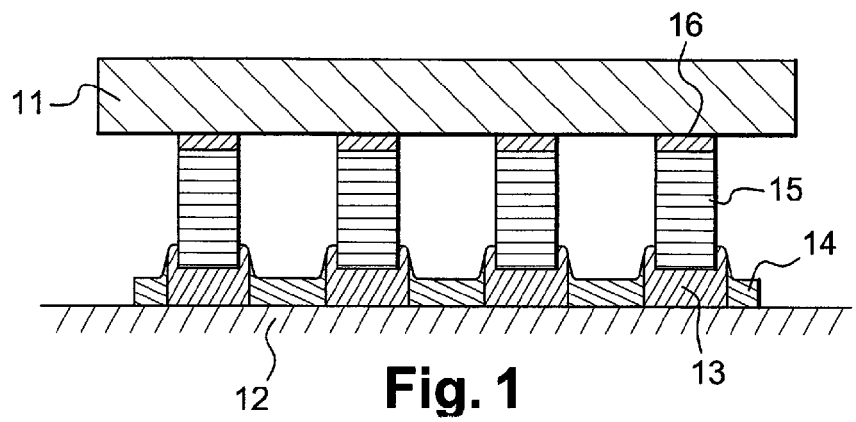
FIG. 1, as already stated, is a schematic representation of a cross section of a sensor of the prior art.
Figure 2:
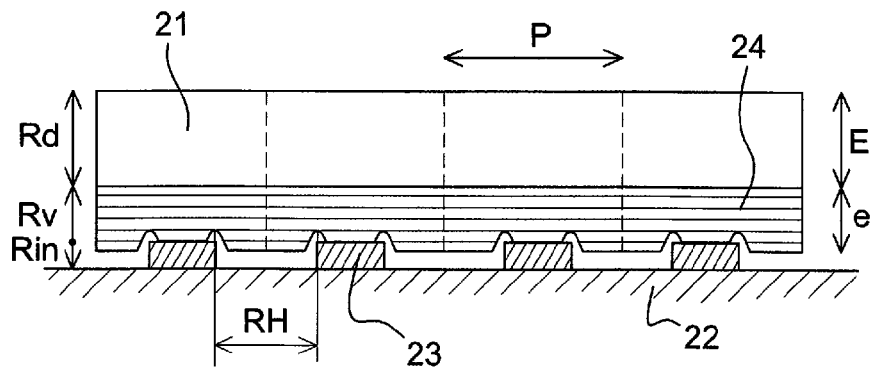
FIG. 2 is a schematic representation of a model of a sensor using a resistive isotropic transfer layer.

To achieve such a transfer yield, the sensor shown in FIG. 2 has the following features, according to a modeling of the principle of the invention.

Firstly, the resistance of the interconnection layer 25 measured substantially perpendicular to an elementary collector 23 is negligible compared to the resistance of the sensing layer 21 measured substantially perpendicular to the same elementary collector 23. In the context of the present invention, negligible means a ratio between these two resistances that is higher than 10, or even to 100.

This feature implies that the bias voltage 28 applied to the sensor is composed of a high potential difference in the sensing layer 21. An electric field is thereby generated having a sufficient strength to shift the charge carriers liberated during interactions between photons and matter towards the elementary collectors 23 constituting the read circuit.

Moreover, the intrinsic resistance of each elementary collector 23 is negligible compared to the sum of the vertical resistance of the interconnection layer 25 and the vertical resistance of the sensing layer 21. This feature enables the elementary collector 23 constituting the read circuit to effectively collect the charge carriers issuing from the sensing layer 21. In fact, the mobile charge carriers can thus penetrate easily into the pad or elementary collector 23.

Furthermore, the sensor modeled in FIG. 2 is characterized in that the quotient defined in the numerator by the resistance of the interconnection layer 25, measured in a direction contained in a plane substantially parallel to the sensing layer 21, and in the denominator by the sum of the intrinsic resistance of any one of the elementary collectors 23 and the resistance of the interconnection layer 25 measured substantially perpendicular to an elementary collector 23, is higher than 3 and in particular higher than 7.

This feature contributes to ensuring a transfer yield higher than 50%, that is, collecting more charge carriers or currents at the elementary collector 23 compared to the charge carriers generated at the elementary collector 23 considered, and collected by the neighboring elementary collectors, in other words, compared to the leakage currents.

In other words, if one considers a plane horizontal sensor, this is the ratio of the current collected vertically at the elementary collector to the leakage currents, substantially oblique, or even horizontal.

In the theoretical case in which the ratio is 100%, the signal-to-noise ratio is a maximum, giving rise to virtually perfect image quality. Conversely, if the ratio is low, for example lower than 50%, the effect is referred to as "spatial blossoming" to describe the scale of the leakage currents, which substantially degrade the resolution of the image.

It is nevertheless considered that it is theoretically impossible to obtain a transfer yield or such a ratio of 100%, even in the case of the sensors of the prior art, in which the pixels are perfectly insulated electrically from one another, because the blossoming of the charge carriers can also occur in the sensing layer despite its high resistivity.

Thus, the resistivity of the interconnection layer 25 is therefore selected so as to obtain these resistances characteristic of the invention. In other words, the resistivity of the transfer layer must be sufficiently low to permit the "vertical" collection in the sense of FIG. 2 of the liberated charge carriers and sufficiently high so that these charge carriers do not "blossom" along the horizontal directions toward the neighboring pads instead of interacting between photons and matter. The electrical behavior of this transfer layer is absolutely specific, and must therefore display an intermediate resistivity between that of a conductive material and that of a half-conductive material, and particularly, closer to that of a half-conductive material.

As indicated above, the transfer yield is expressed by the equation: $(R_H+R_V+R_{in})/[R_H+(R_V+R_{in})*(1+K)]$.

In fact, the number of neighboring elementary collectors may range from three, when the elementary collector concerned occupies one of the corners of the matrix, to eight, when the elementary collector concerned is at any location within the matrix. In the latter case, it is necessary to make a distinction between the neighboring elementary collectors, because they are not all located at the same distance from the elementary collector concerned. Thus, among the eight neighbors positioned in a square around a pad, the four pads occupying the corners of this square are further from the central pad, while the other four are closer.

A particular case exists in which the intrinsic resistances $R_{in}$ is negligible compared to the resistances $R_H$ and $R_V$. In this case, the equation defining the transfer yield can be simplified and then only depends on the resistances $R_H$ and $R_V$. This simplified equation is written: $(R_H+R_V)/[R_H+(R_V)*(1+K)]$.

Typically, the resistivity of the interconnection layer 25 is between $10^5$ and $10^8 \Omega.cm$, the sensing layer 21 having a resistivity typically between $10^8$ and $10^{12}$ $\Omega/cm$.

According to another essential feature of the invention, the sensor also comprises a mating layer 26, to carry out the mating and hence the maintenance of the assembly consisting of the sensing layer 21 and the interconnection layer 25 to the substrate 22 provided with the elementary collectors 23.

This mating layer 26 is therefore limitatively dedicated to this mating function only. It is electrically insulating to avoid disturbing the collection of the charges by the elementary collectors 23.

As a corollary, the interconnection layer 25 is connected to the sensing layer 21. It provides the electrical interconnection between the sensing layer 21 and the elementary collectors 23.

Through this arrangement, the interconnection and mating functions are physically uncoupled.

As for the interconnection layer 25, an adhesive polymer film is used for the mating layer 26, but it is electrically insulating in this case.

More particularly, and advantageously, the adhesive used to constitute the isotropic interconnection layer is only partially or completely polymerized, before the actual mating step, thereby allowing the use of a wider range of adhesives insofar as, according to the interconnection function alone, this eliminates the limitations on mating.

In doing so, an adhesive at a higher polymerization temperature can be used, and also an adhesive containing a solvent.

Furthermore, very good uniformity of electrical behavior of the adhesive constituting this interconnection layer can be obtained, once it is crosslinked.

Moreover, this makes it possible to adjust the thickness of the interconnection layer 25 exclusively with regard to the desired interpixel resistance and independently of the planeity of the components to be mated.

The assembly consisting of the sensing layer 21 and the interconnection layer 25 is mated to the read circuit consisting of the substrate 22 and the elementary collectors 23 by a process of thermo-compression by means of the insulating adhesive 26 that provides the mechanical mating.

To permit electrical contact between the elementary collectors 23 of the read circuit 22 and the interconnection layer 25, protuberances 29 are provided on the elementary collectors 23.

In doing so, due to this thermo-compression, the interconnection between the interconnection layer 25 and the protuberances 29 of the elementary collectors 23 is obtained by direct contact.

Figure 4:
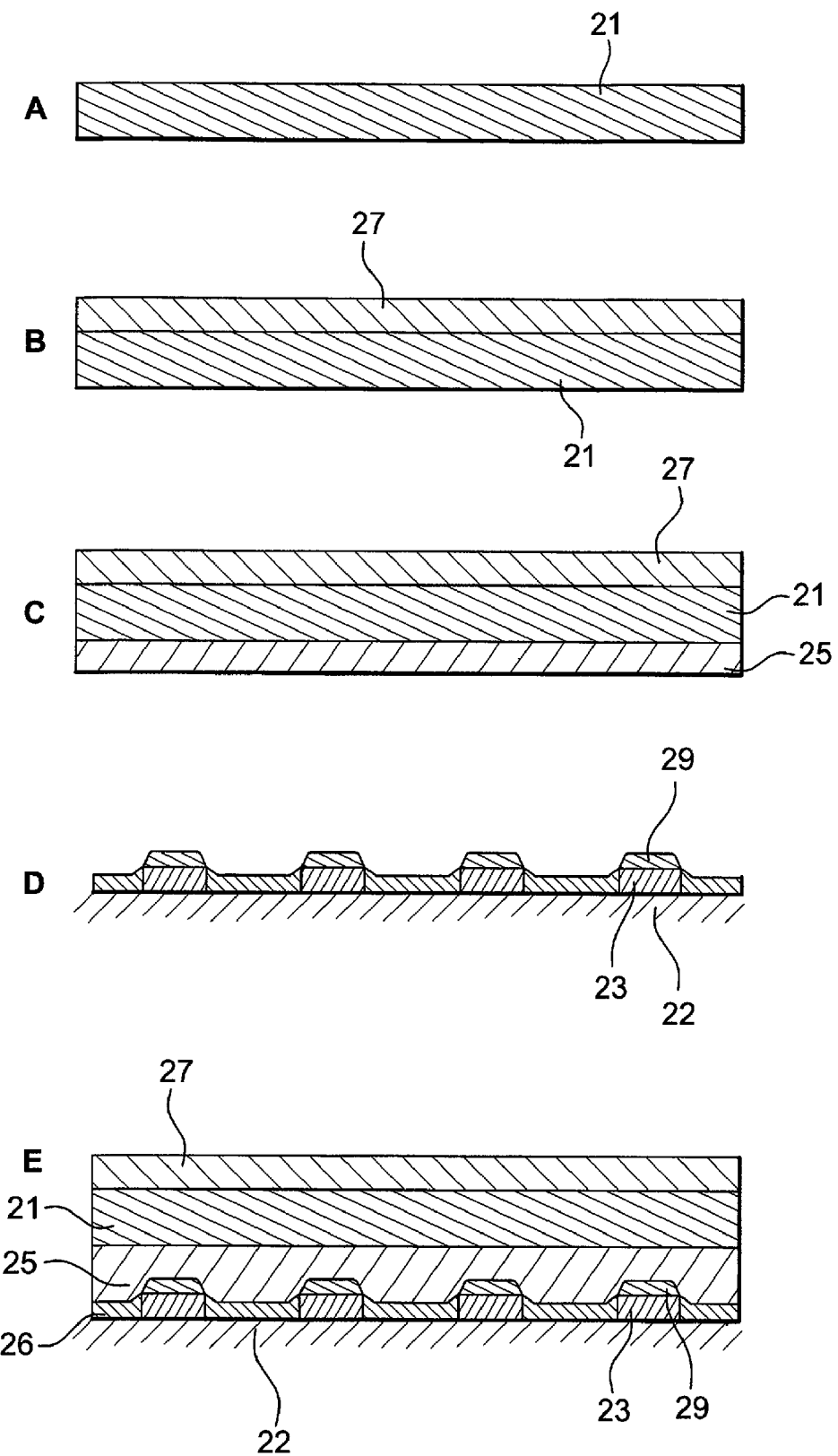
FIG. 4 is a schematic view showing the matching method of a sensor according to the invention.

In connection with FIG. 4, a method for preparing the electromagnetic radiation sensor according to the invention will now be described.

The adhesive constituting the interconnection layer 25 is first prepared. The aim in the abovementioned numerical example is to obtain a resistivity of between $10^5$ and $10^8$ $\Omega.cm$ for this layer.

For this purpose, an adhesive is used, such as marketed under the reference E320 by EPOTEK. This isotropic adhesive consists of submicron-scale particles incorporated in an adhesive epoxy type matrix. This bicomponent material comprises a base and a hardener with a proportion of submicron-scale carbon particles of about 20% by weight.

This adhesive is mixed with another epoxy adhesive, chemically compatible, perfectly dielectric, and such as sold by EPOTEK under the reference E301. The relative proportion of the mixture of these two adhesives is selected to obtain the desired resistivity lying within the abovementioned range.

It is observed that the weight proportion of the dielectric adhesive E301 should not exceed 50%, in order to maximize the interpixel insulation.

The sensing layer 21 consists, as already stated, of a material capable of sensing a radiation, and in the present case X- or γ rays. These materials are well known today and consist of high resistivity semiconductors belonging to the families II-VI or III-V, generally having a high atomic number. The best known and the most commonly used are in particular CdTe, CdTe doped with chlorine, CdZnTe, HgCdTe, silicon, gallium arsenide (AsGa), lead oxide (PbO), lead iodide ($PbI_2$), mercury iodide ($HgI_2$), selenium, etc.

This photoconductor 21 may be of the self-supportive type and fabricated by conventional techniques for producing semiconductors.

It may however also be deposited in a thick layer on a substrate transparent to the radiation to be detected, such as graphite, aluminum, and more generally, any conductive low atomic weight element, chemically compatible with the photoconductor. For example, use can be made of a photoconductive layer based on CdTe obtained by the Close Space Sublimation (CSS) technique on a graphite substrate.

For applications concerning the detection of X- or γ radiation, the thickness of the sensing layer 21 is typically between 50 microns and one centimeter. This thickness can be increased or decreased for other applications. Its resistivity is generally between $10^8$ and $10^{12}$ $\Omega.cm$.

When said photodetector 21 is self-supported, a common electrode 27, is deposited, by any technique of thin metal film deposition in particular, and especially by evaporation, sputtering, or even by electroless growth.

The next step is the deposition of the adhesive constituting the interconnection layer 25 (FIG. 4C).

The adhesive prepared as previously described and not polymerized is spread on the photoconductor 21 in the form of a film. Any screen-printing technique can be used for depositing said adhesive, especially coating, spin coating, or more generally, any technique suitable for forming a thin film of viscous liquids.

The thickness of this film is typically between 1 and 20 μm. A very fine thickness serves in fact to limit the interpixel leakage, whereas a thicker layer makes the assembly more tolerant with regard to the planeity of the photodetector and/or the uniformity of thickness of the protuberances 29 of the pads or elementary collectors 23 of the read circuit.

Once the polymer layer is deposited in the form of a film, it is polymerized partially or completely by a thermal cycle. However, to obtain intimate contact subsequently with the protuberances 29 of the elementary collectors 23 of the read circuit, it is important for this layer to preserve some flexibility, hence the advantage of crosslinking or partial polymerization of said layer, while the total crosslinking is obtained during or after the mating phase, described below.

The read circuit is then prepared (FIG. 4D).

The read circuit is a substrate provided with conductive pads 23. These conductive pads or elementary collectors 23 make it possible, as already stated, to collect the charges photocreated in the photodetector 21 via the interconnection layer 25. In its simplest form, these pads are individually connected to test or output pads (substrate called interconnection grid). In a more evolved form, the substrate comprises electronic signal processing components: this may be an ASIC, a CMOS circuit, a board based on a TFT (Thin Film Transistor), a Charge Coupled Device (CCD) board, etc. Conventionally, the interconnection pads 23 of the read circuit have an aluminum or copper finish for obvious reasons of conduction.

To produce the protuberances 29, a non-oxidizable metal is preferably selected as a finish, having a conductive metal character of a few tenths of microns. This metal may be gold, platinum, palladium or silver. Between the finish of the read circuit and that of the protuberance, it is also possible to use another metal than that of the finish, which is generally thicker (usually less than 10 microns), and such as for example nickel, copper, titanium, zirconium, tantalum, tungsten, molybdenum, vanadium, chromium, or even one or more alloys or nitrides of these elements.

The read circuit is generally provided with a mineral passivation separating the metal pads. The pads may be produced by electroless electrolysis, thereby serving to produce Ni/Au pads a few microns thick, typically 1 to 10 microns.

The actual mating is then carried out (FIG. 4E).

Two alternatives are available for mating the assembly consisting of the photodetector 21 and the interconnection layer 25, and the read circuit 22, 23.

In a first alternative, the photoconductor 21 provided with the isotropic resistive interconnection layer 25 partially polymerized (example for 1 hour at 50° C.) is placed facing the read substrate provided with its pads or elementary collectors 23, and for example consisting of a CMOS imaging circuit, having a matrix of pads at a step of 75 microns. It should be emphasized that the alignment of the photodetector 21 provided with the interconnection layer 25 with the substrate 22 of the read circuit is relatively coarse, insofar as there is no electrode on the photoconductor 25.

A thermo-compression cycle is applied with a low pressure, typically less than $10^{-1}$ MPa at 50° C. for 1 hour. This cycle serves to obtain a complete crosslinking of the isotropic resistive interconnection layer 25, and ensures moderate mechanical strength of the assembly, since the only mating points are located at the protuberances 29. To obtain reinforced mechanical strength, adhesive is infiltrated by capillarity from one of the sides of the assembly to fill the space between the isotropic polymer layer 25 and the read circuit. This adhesive, thus incorporated, is then polymerized.

In such a configuration, a very fluid adhesive can advantageously be used, such as that already mentioned from EPOTEK under reference E301, which also polymerizes at low temperature, and for example for 2 hours at 50° C.

This mating process is suitable for the case of the mating of sensors with small areas (a few square millimeters).

In the case of large mating areas, control of the capillarity is complex and favorable to the formation of bubbles, leading to the use of another technique described below.

In this second configuration, the read circuit is coated with a thin film of insulating adhesive of the type previously described (E320-EPOTEK). The film thickness, and hence the quantity of adhesive, is calculated according to the height of the protuberances 23, in order to completely but not excessively fill the space between the read circuit and the isotropic resistive interconnection layer 25. The photoconductor 21 provided with the isotropic resistive layer 25 that is completely polymerized is then placed opposite, subjected for example for 2 hours to a temperature of 50° C., and the read substrate coated with the insulating adhesive 26. Here also, it should be pointed out that the alignment of one to the other is relatively coarse, insofar as the photoconductor has no electrodes.

A thermo-compression cycle is applied with a low pressure typically less than $10^{-1}$ MPa at 50° C. for 2 hours, to achieve a complete crosslinking of the insulating layer 26 ensuring the mechanical mating.

The insulating adhesive 26, possibly located above the protuberances 29 is expelled therefrom during the thermo-compression process, thereby ensuring electrical contact between said protuberances 29 and the transfer or interconnection layer 25.

It should be observed that during the thermo-compression phase the protuberances 29 of the elementary collectors 23 expel the rare bubbles from the contact zones with the isotropic resistive interconnection layer 25, thereby ensuring good electrical contact. This method only causes the formation of a limited number of bubbles in the assembly, which moreover are not detrimental to the quality of the mechanical mating.

In order to optimize this alternative assembly, it is also possible to carry out a thermo-compression under moderate vacuum, in order to further decrease the appearance of bubbles in the assembly.

The method and the sensor according to the invention have a certain number of advantages described below.

Firstly, is important to stress the uncoupling between the actual interconnection function and mating function. In doing so, it becomes possible to optimize the uniformity of resistive behavior of the interconnection layer 25 independently of the mating function, particularly by the disappearance or the drastic reduction of the bubbles liable to remain trapped at the interfaces, and which give rise to interconnection defects in case of the use of a conductive adhesive. In the context of the inventive method, the conductive isotropic interconnection layer 25 is at least partially polymerized before mating, thereby guaranteeing the absence of such bubbles at the contact with the photodetector 21. During the thermo-compression phase, any bubbles are expelled outside the protuberances 29, between the pads 23 of the read circuit, which does not affect the electrical interconnection between the interconnection layer 25 and the read circuit, nor does it significantly reduce the mechanical adhesion.

It may be considered to use a reparable material as a mating (insulating) layer. In this case, use can be made in particular of a silicone, which loses its adhesive properties in a suitable solvent, which may for example consist of trichloroethylene ($CHCl_3$).

In the sensor of the invention, there is no pixelization of the anode, and the electric field lines resulting from the bias voltage 28 of the sensor entirely cover said sensor, thereby eliminating the "dead" zones of the photoconductor and thereby serving to maximize the yield of photocreated charges, and consequently, the signal-to-noise ratio, contrary to the sensors of the prior art, in which the charges generated in the photoconductor are collected by the anodes along electric field lines, causing the formation of "dead" zones, giving rise to tailing and a ghost effect.

In other words, in the sensor of the invention, there is no depixelization of said sensor, the pixelization of the image being imposed not by the sensor, but by the geometry of the electrodes of the signal processing susbtrate (read circuit).

In the context of said sensor of the invention, the charges are collected directly by means of an isotropic resistivity layer (interconnection layer 25). Contrary to the prior art, in which the electrodes are produced directly on the photodetector or on an intermediate half-conductive layer, requiring the use of costly photolithographic processes and liable to degrade the performance of the photodetector.

Furthermore, this resistive layer 25 does not consist of a thin film of amorphous silicon or other materials, but simply consists of an adhesive polymer material, which can be obtained by a simple, inexpensive technique, such as screen-printing for example, and all the coating techniques, or more generally, any technique suitable for the formation of a thin film of viscous liquid.

Moreover, the use of an adhesive polymer material as an interconnection resistivity layer serves to use adhesives that polymerize at low temperatures, typically lower than 100° C., or even lower than 50° C., thereby limiting the risks of damage to the electronic properties of the photoconductor, preserving some flexibility in the layer thus produced, even after polymerization, and serving to obtain and guarantee a good electrical contact by subsequent thermo-compression on the protuberances 29 of the read circuit, without applying excessive pressure, as it involves a hard material (pad of the read circuit)/soft material (layer of adhesive polymer) contact.

Besides, due to the use of such an adhesive polymer material, it is possible to test the performance of the sensor on a test substrate exclusively by light pressurization, before its mating by adhesive to the final read circuit.

Moreover, the use of a flexible and compressible polymer layer serves to allow for all the planeity defects inherent in the fabrication of the sensor and/or the read circuit.

It may also be stressed that it is possible to use, for the fillers included in the isotropic adhesive constituting the interconnection layer 25, carbon or other conductive materials, such as intrinsically conductive polymers, which are stable and chemically compatible with the photoconductor 21. This helps to avoid the use of metal electrode materials which react with the sensor by diffusion.

The use of an insulating adhesive for the actual mating makes it possible to select it so that it has a low polymerization temperature typically lower than 100° C., or even lower than 50° C., which is particularly advantageous for mating large dimensioned components (several hundred square centimeters). In fact, the photoconductors 21 and the silicon constituting the read circuit do not have the same thermal expansion coefficients, and this could generate thermomechanical stresses, or even damage when mating at high temperature. Moreover, low temperature polymerization serves to limit the risks of damage to the sensing layer.

Furthermore, with the invention, the interconnection material (layer 25) is deposited in a solid layer, contrary to the prior art techniques, in which it is necessary to structure the interconnection material discretely, either by subtractive techniques of photolithography, or by additive techniques of screen- or ink jet printing, which all require controlling the quantity of material for each interconnection pad, this control becoming particularly critical when the pixel step becomes typically lower than 100 microns and virtually unfeasible for steps lower than 50 microns.

It appears from the above that the invention proves to be particularly simple to use for the production of systems for detecting electromagnetic radiation, particularly for small steps (less than 100 microns) but also applicable for larger steps.

In addition to the fact that the interconnection (layer 25) material is deposited in a solid layer, the same photodetector can be assembled equally with various read circuits having a different matrix size or pixel step, without requiring specific preparation of the sensor.

The invention described above can be applied equally well to collecting charges created by the interaction of an ionizing radiation in a half-conductive material, whether these charges are positive or negative. Although the figures and examples described represent a collection of negative charges, it may be understood that the invention applies also to the collection of positive charges.

The invention claimed is:

1. A device for detecting electromagnetic radiation and ionizing radiation, in particular X-rays or rays, comprising:
    a sensing layer consisting of at least one material capable of interacting with said electromagnetic radiation to be detected, in order to liberate mobile charge carriers, where movement of the mobile charge carriers generates an electric current;
    a substrate provided with a plurality of elementary collectors of the charge carriers thus liberated, said elementary collectors being distributed discretely;
    a transfer layer consisting of an electrically conductive polymer layer, suitable for transferring the charge carriers liberated by the sensing layer at the elementary collectors, said layer being connected to the sensing layer; and
    an insulating adhesive mating layer for mating the plurality of elementary collectors and the transfer layer.

2. A device for detecting electromagnetic radiation and ionizing radiation as claimed in claim 1, wherein the transfer layer is adhesive, and wherein the mating layer consists of an insulating adhesive polymer layer.

3. A device for detecting electromagnetic radiation and ionizing radiation as claimed in claim 1, wherein the transfer layer is continuous and has an isotropic resistivity.

4. A device for detecting electromagnetic radiation and ionizing radiation as claimed in claim 1, wherein the transfer yield of the transfer layer is higher than 50%, and in particular higher than 75%, said yield being defined by the expression:

$$(R_H + R_V + R_{in})/[R_H + (R_V + R_{in})*(1+K)]$$ where:

$R_V$ is the resistance of the transfer layer measured substantially perpendicular to an elementary collector;
$R_H$ is the resistance of the transfer layer measured in a direction contained in a plane substantially parallel to the sensing layer;
$R_{in}$ is the input resistance, also called "input impedance" of any one of the elementary collectors; and
K is a number and a multiple of 4, representing the number of elementary collectors next to the elementary collector considered.

5. A device for detecting electromagnetic radiation and ionizing radiation as claimed in claim 1, wherein the transfer layer consists of an organic thermoplastic or thermoset material.

6. A device for detecting electromagnetic radiation and ionizing radiation as claimed in claim 5, wherein the organic material consists of polymers selected from the group comprising epoxies, acrylates, polyurethanes and silicones, incorporating conductive particles.

7. A device for detecting electromagnetic radiation and ionizing radiation as claimed in claim 6, wherein the conductive particles have a submicron size, and are selected from the group comprising carbon, gold, platinum, silver, nickel, aluminum and copper.

8. A device for detecting electromagnetic radiation and ionizing radiation as claimed in claim 5, wherein the adhesive constituting the transfer layer has a Shore D hardness lower than 100 when it is polymerized.

9. A device for detecting electromagnetic radiation and ionizing radiation as claimed in claim 1, wherein the transfer layer consists of an organic thermoplastic or thermoset material incorporating an intrinsically conductive polymer.

10. A device for detecting electromagnetic radiation and ionizing radiation as claimed in claim 9, wherein the organic material consists of polymers selected from the group comprising epoxies, acrylates, polyurethanes and silicones.

11. A device for detecting electromagnetic radiation and ionizing radiation as claimed in claim 9, wherein the intrinsically conductive polymer is selected from the group comprising polyaniline, polypyrole and polythiophene.

12. A device for detecting electromagnetic radiation and ionizing radiation as claimed in claim 1, wherein the electrically insulating adhesive polymer layer consists of a material selected from the group comprising epoxies, acrylates and silicones.

* * * * *